(12) United States Patent
Tanaka

(10) Patent No.: US 10,418,581 B2
(45) Date of Patent: Sep. 17, 2019

(54) LIGHT EMITTING DEVICE

(71) Applicant: Pioneer Corporation, Bunkyo-ku, Tokyo (JP)

(72) Inventor: Yohei Tanaka, Kawasaki (JP)

(73) Assignee: PIONEER CORPORATION, Tokyo (JP)

( * ) Notice: Subject to any disclaimer, the term of this patent is extended or adjusted under 35 U.S.C. 154(b) by 45 days.

(21) Appl. No.: 15/561,322

(22) PCT Filed: Mar. 25, 2015

(86) PCT No.: PCT/JP2015/059236
§ 371 (c)(1),
(2) Date: Sep. 25, 2017

(87) PCT Pub. No.: WO2016/151818
PCT Pub. Date: Sep. 29, 2016

(65) Prior Publication Data
US 2018/0102495 A1    Apr. 12, 2018

(51) Int. Cl.
*H01L 51/52* (2006.01)
*H01L 51/00* (2006.01)
(Continued)

(52) U.S. Cl.
CPC ...... *H01L 51/5203* (2013.01); *H01L 51/0022* (2013.01); *H01L 51/5212* (2013.01);
(Continued)

(58) Field of Classification Search
CPC .................. H01L 51/5203; H01L 51/0022
See application file for complete search history.

(56) References Cited

U.S. PATENT DOCUMENTS 4,540,983 A * 9/1985 Morimoto ................ G09G 3/22
313/497
4,878,022 A * 10/1989 Carlson ................ G01R 33/341
324/318
(Continued)

FOREIGN PATENT DOCUMENTS

CN    100433355 B    11/2008
GB    2401711 A    11/2004
(Continued)

OTHER PUBLICATIONS

Office Action for JP App No. 2017-507261 dated Feb. 26, 2018, 4 pgs.
(Continued)

*Primary Examiner* — Ibrahim Siddo
(74) *Attorney, Agent, or Firm* — Procopio, Cory, Hargreaves & Savitch LLP

(57) ABSTRACT

A light emitting device (10) includes a substrate (100) and a light emitting unit. The light emitting unit includes a first electrode (110), an organic layer (120), and a second electrode (130). The organic layer (120) is located between the first electrode (110) and the second electrode (130). The conductor (180) extends in the first direction (y direction) and at least a portion thereof is in contact with any surface of the first electrode (110). The conductor (180) contains conductive particles and includes a first portion (181) and a second portion (183). The second portion (183) is thicker than the first portion (181). The first portion (181) and the second portion (183) are aligned in the first direction and connected to each other.

10 Claims, 15 Drawing Sheets

(51) Int. Cl.
*H05B 33/28* (2006.01)
*H04N 1/028* (2006.01)

(52) U.S. Cl.
CPC ..... *H01L 51/5228* (2013.01); *H04N 1/02815* (2013.01); *H05B 33/28* (2013.01); *H01L 2251/558* (2013.01)

(56) References Cited

U.S. PATENT DOCUMENTS

| | | | |
|---|---|---|---|
| 6,133,581 | A | 10/2000 | Terao et al. |
| 7,303,635 | B2 | 12/2007 | Yamaguchi |
| 7,547,918 | B2 | 6/2009 | Azumada et al. |
| 7,638,807 | B2 | 12/2009 | Yukinobu |
| 7,901,538 | B2 | 3/2011 | Yukinobu |
| 8,114,720 | B2 | 2/2012 | Yamazaki |
| 8,237,167 | B2 | 8/2012 | Yamazaki |
| 8,304,656 | B2 | 11/2012 | Okamori |
| 8,431,941 | B2 | 4/2013 | Aoki et al. |
| 8,598,783 | B2 | 12/2013 | Yamaguchi |
| 8,659,220 | B2 | 2/2014 | Sakaguchi |
| 8,710,735 | B2 | 4/2014 | Shirai et al. |
| 8,828,477 | B2 | 9/2014 | Yamaguchi |
| 8,878,175 | B2 | 11/2014 | Yamazaki |
| 8,970,105 | B2 | 3/2015 | Yamaguchi |
| 9,184,225 | B1 | 11/2015 | Yamaguchi |
| 9,188,323 | B2 | 11/2015 | Yamazaki et al. |
| 9,768,280 | B2 | 9/2017 | Yamazaki |
| 2005/0001546 | A1 | 1/2005 | Yamaguchi |
| 2005/0285987 | A1 | 12/2005 | Azumada et al. |
| 2006/0292384 | A1* | 12/2006 | Kazaryan ............... H01G 11/22 428/457 |
| 2007/0079869 | A1 | 4/2007 | Yukinobu |
| 2007/0106363 | A1* | 5/2007 | Weber .................. A61L 27/303 623/1.11 |
| 2008/0088227 | A1* | 4/2008 | Lee .................... H01L 51/5203 313/504 |
| 2008/0271843 | A1 | 11/2008 | Yukinobu |
| 2010/0167464 | A1 | 7/2010 | Yamazaki |
| 2010/0171129 | A1 | 7/2010 | Aoki et al. |
| 2010/0224392 | A1 | 9/2010 | Okamori |
| 2010/0294544 | A1* | 11/2010 | Momota ............. H05K 3/4691 174/254 |
| 2012/0099331 | A1 | 4/2012 | Yamazaki et al. |
| 2012/0119214 | A1 | 5/2012 | Yamazaki |
| 2012/0268682 | A1 | 10/2012 | Yamazaki |
| 2013/0093316 | A1 | 4/2013 | Sakaguchi |
| 2013/0221341 | A1 | 8/2013 | Iwabuchi et al. |
| 2013/0320841 | A1 | 12/2013 | Shirai et al. |
| 2014/0349429 | A1 | 11/2014 | Yamaguchi |
| 2015/0037944 | A1 | 2/2015 | Yamazaki |
| 2015/0137106 | A1 | 5/2015 | Yamaguchi |
| 2017/0098768 | A1 | 4/2017 | Yamaguchi |
| 2017/0373172 | A1 | 12/2017 | Yamazaki |

FOREIGN PATENT DOCUMENTS

| | | |
|---|---|---|
| JP | 2000-082588 A | 3/2000 |
| JP | 2003-318516 A | 11/2003 |
| JP | 2004-327070 A | 11/2004 |
| JP | 2004-335389 A | 11/2004 |
| JP | 2006039509 A | 2/2006 |
| JP | 3915734 B2 | 5/2007 |
| JP | 2008-103305 A | 5/2008 |
| JP | 2008238631 A | 10/2008 |
| JP | 2010160250 A | 7/2010 |
| JP | 2010-234354 A | 10/2010 |
| JP | 2011-113815 A | 6/2011 |
| JP | 2012-094348 A | 5/2012 |
| JP | 2012109225 A | 6/2012 |
| JP | 2012-174517 A | 9/2012 |
| JP | 2014168061 A | 9/2014 |
| KR | 101021542 B1 | 3/2011 |
| TW | 1232700 B | 5/2005 |
| WO | 2005/041217 A1 | 5/2005 |
| WO | 2011155306 A1 | 12/2011 |

OTHER PUBLICATIONS

Office Action for related JP App No. 2017-507261 dated Oct. 2, 2018, 4 pgs.
International Search Report and Written Opinion for PCT App No. PCT/JP2015/059236 dated Jun. 23, 2015, 13 pgs.
Office Action for related JP App No. 2017-507261 dated Jun. 4, 2019, 2 pgs.

* cited by examiner (a)

LIQUID DROPLET : 7pl

| COATING INTERVAL | 5 SECONDS | 10 SECONDS | 40 SECONDS | 80 SECONDS | 100 SECONDS |
|---|---|---|---|---|---|
| CROSS-SECTIONAL PROFILE OF CONDUCTOR | ○ | ○ | △ | × | × |
| b/a | 0.7 | 1.4 | 5.7 | 11.4 | 14.3 |

LIGHT EMITTING DEVICE

CROSS-REFERENCE TO RELATED APPLICATIONS

This application is a U.S. National Stage entry of PCT Application No. PCT/JP2015/059236, filed on Mar. 25, 2015, the contents of which are incorporated herein by reference.

TECHNICAL FIELD

The present invention relates to a light emitting device.

BACKGROUND ART

An optical device having an optical element, such as a light emitting element or a photoelectric conversion element, formed on a substrate includes a transparent electrode made of a light transmissive conductive material. Since the light transmissive conductive material is generally high in resistance, the transparent electrode would also be high in resistance. Therefore, in order to lower the resistance of the transparent electrode, the transparent electrode is sometimes provided with an auxiliary electrode, as illustrated in Patent Document 1, for example. In Patent Document 1, the auxiliary electrode is formed on the transparent electrode and covered by an insulating film. Patent Document 1 also discloses inkjet printing as one of the methods of forming the auxiliary electrode.

RELATED DOCUMENT

Patent Document

[Patent Document 1] Japanese Laid-open Application Patent Publication No. 2012-94348

SUMMARY OF THE INVENTION

Technical Problem

In order to lower the resistance of a conductor such as an auxiliary electrode, it is necessary to increase the cross-sectional area of the conductor. In order to increase the cross-sectional area of the conductor, the width or the height of the conductor needs to be increased. However, since the conductor is generally formed of a material having light shielding properties, increasing the width of the conductor may narrow the light transmitting region of the optical element or may reduce the aperture ratio of the optical device. Further, when the conductor is formed through coating by inkjet printing, changing the height of the conductor was conventionally difficult.

An exemplified problem to be solved by the invention is to lower the resistance of a conductor in a light emitting device by increasing the height of the conductor without increasing the width thereof.

Solution to Problem

According to claim 1 of the invention, there is provided a light emitting device comprising a substrate, a light emitting unit over the substrate, the light emitting unit comprising a first electrode, a second electrode, and an organic layer between the first and second electrodes, and a conductor extending in a first direction, at least a portion thereof in contact with any surface of the first electrode, wherein the conductor contains a conductive particle and comprises a first portion and a second portion thicker than the first portion, and wherein the first and second portions are aligned in the first direction and connected to each other.

BRIEF DESCRIPTION OF THE DRAWINGS

The above-described object, other objects, features, and advantages are more apparent in preferred embodiments to be described below and the following drawings appended to the embodiments.

FIG. 5 is a diagram illustrating results obtained by examining the period of time from completion of formation of a first layer until a start of formation of a second layer and the quality of a cross-sectional profile of a conductor.

DESCRIPTION OF EMBODIMENTS

Figure 1:
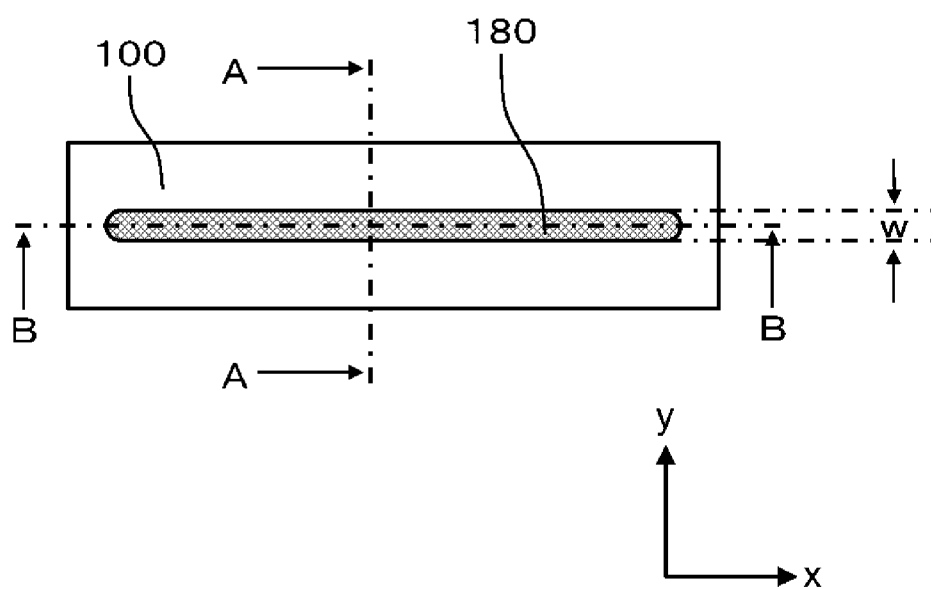
FIG. 1 is a plan view illustrating a conductor according to a first embodiment.

Hereinafter, embodiments of the invention will be described with reference to the drawings. Throughout all the drawings, the same reference numerals are given to elements with the same configurations and the description thereof will not be repeated.

First Embodiment

Figure 2:
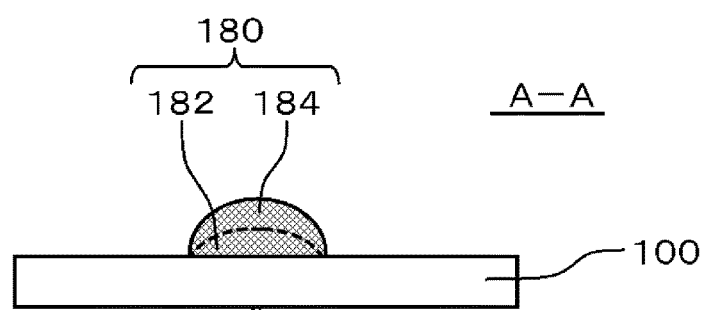
FIG. 2 is a sectional view taken along line A-A of FIG. 1.
Figure 3:
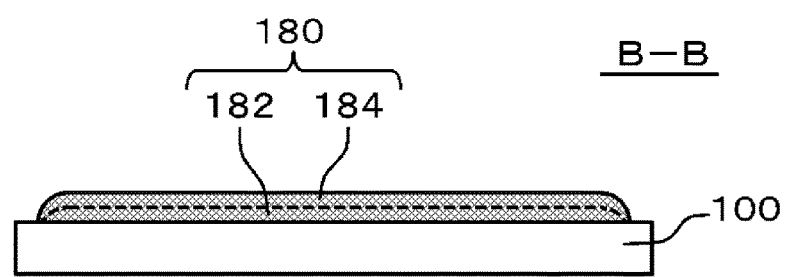
FIG. 3 is a sectional view taken along line B-B of FIG. 1.

FIG. 1 is a plan view illustrating a conductor 180 according to a first embodiment. FIG. 2 is a sectional view taken along line A-A of FIG. 1 and FIG. 3 is a sectional view taken along line B-B of FIG. 1. The conductor 180 according to the embodiment is formed on a substrate 100 and extends in a first direction (the x direction in FIG. 1). The conductor 180 is configured by superimposing a second layer 184 on a first layer 182. Both the first layer 182 and the second layer 184 have conductivity and are formed by inkjet printing using ink containing conductive particles (for example, metal nanoparticles such as silver nanoparticles). Therefore, the first layer 182 and the second layer 184 are configured of plural conductive particles bound together by sintering. As will be described in detail below, a heat treatment for sintering the plural conductive particles is performed after formation of both the first layer 182 and the second layer 184. Therefore, there is no boundary between the first layer 182 and the second layer 184 in some cases.

In the example illustrated in FIGS. 2 and 3, the conductor 180 includes two layers of the first layer 182 and the second layer 184. In other words, the conductor 180 is formed by coating ink containing conductive particles in layers. Therefore, compared to a case of coating the ink containing conductive particles once to form the conductor 180, the conductor 180 can be further increased in height without increasing the width thereof (for example, the increased height may be 1.9 times or more and 2.1 times or less). A width w of the conductor 180 is equal to or less than, for example, 100 μm, and a ratio of the height to the width (an aspect ratio) of the conductor 180 is equal to or more than, for example, 0.002 (0.1/50) times. Here, the conductor 180 may be configured to have more coated layers (a multicoated structure). In this case, it is possible to further increase the height of the conductor 180. It is also possible to further increase the foregoing aspect ratio.

As described above, the first layer 182 and the second layer 184 of the conductor 180 are formed by inkjet printing. Therefore, as illustrated in FIGS. 2 and 3, end portions of the conductor 180 become gradually thinner toward the ends from the center of the conductor 180.

The conductor 180 is, for example, an auxiliary electrode of a transparent electrode of a light emitting device, but the invention is not limited thereto. In addition, another layer (for example, a transparent conductive layer) may be formed between the substrate 100 and the conductor 180.

Figure 4:
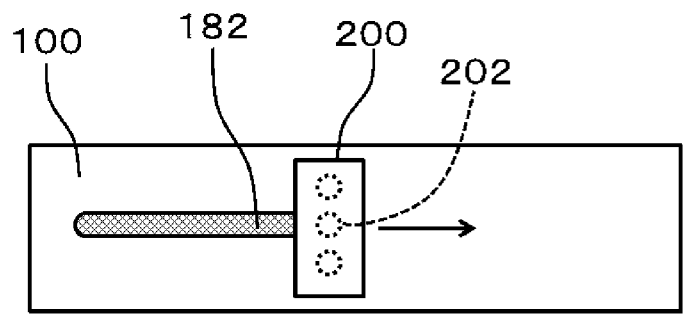
FIG. 4 are diagrams illustrating a method of forming a conductor.
Figure 4:
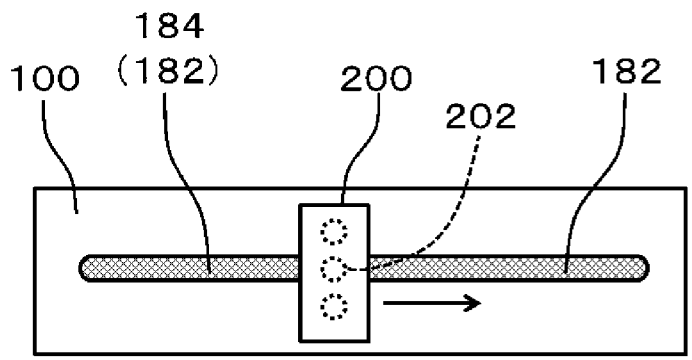
Figure 4:
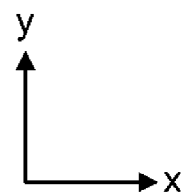

FIG. 4 are diagrams illustrating a method of forming the conductor 180. Processes illustrated in the drawings are performed, for example, under atmospheric pressure. The substrate 100 is at, for example, a room temperature (20° C.) First, as illustrated in FIG. 4(*a*), a liquid droplet of ink is ejected from an ejection nozzle 202 while moving an ejection head 200 from a predetermined position in a first direction (the x direction in FIG. 4) to thereby form the first layer 182. In general, the inkjet ejection head 200 includes plural ejection nozzles 202. When forming the conductor 180, liquid droplets are preferably ejected from a portion of the ejection nozzles 202 (for example, one ejection nozzle 202).

Subsequently, as illustrated in FIG. 4 (*b*), the ejection head 200 is moved in a direction opposite to the first direction to be returned to the predetermined position. Then, after an elapse of a predetermined period of time, an ink liquid droplet is ejected from the ejection nozzle 202 while moving the ejection head 200 again in the first direction. Thus, the second layer 184 is formed on the first layer 182.

In this way, the second layer 184 is formed after elapse of a predetermined period of time from completion of formation of the first layer 182. Therefore, the first layer 182 is dried to some extent before the second layer 184 is formed. Accordingly, even when the second layer 184 is formed before sintering the first layer 182, the second layer 184 is able to be superimposed on the first layer 182. In other words, by coating the ink in layers, the height of the conductor 180 is increased and the conductor 180 does not spread when the ink is applied in layers. If the first layer 182 becomes too dry, unevenness of the surface of the second layer 184 becomes considerable.

The degree of dryness of the ink from the time of ejection from the ejection nozzle 202 to the time of attachment to the substrate 100 varies depending on the size of the liquid droplet. Therefore, as the size of the liquid droplet increases, it is desirable to increase the above-described predetermined period of time. Specifically, when the amount of a liquid droplet on forming the first layer 182 is "a" (picoliter: pl) and the predetermined period of time is "b" (second), $0.5 \leq b/a \leq 3$ is preferably true. In this way, it is possible to achieve an appropriate dryness of the first layer 182 before forming the second layer 184, for example, the appropriate dryness being a dryness at which the end portions of the first layer 182 are dry.

Here, if the ejection nozzle 202 used for forming the second layer 184 is different from the ejection nozzle 202 used for forming the first layer 182, there is a high possibility that the positions of the first layer 182 and the second layer 184 may be deviated from each other by about several tens of μm in the y direction in FIG. 4. In such a case, the ejection head 200 needs to be moved in the y direction in FIG. 4 for positioning. However, there is a limit to precision of such positioning. Accordingly, in the present embodiment, the same ejection nozzle 202 is used for forming both the first layer 182 and the second layer 184. Thus, it is not necessary to move the ejection head 200 in the y direction during the period of time between completion of formation of the first layer 182 and start of formation of the second layer 184. Accordingly, it is possible to superimpose the second layer 184 on the first layer 182 with high precision.

Thereafter, the substrate 100 is heated. Thus, the plural conductive particles contained in the first layer 182 and the plural conductive particles contained in the second layer 184 are sintered to form the conductor 180. At this time, the shapes of the conductive particles at least partly remain in the conductor 180.

To quicken the drying of the first layer 182, the substrate 100 may be heated after the first layer 182 is formed and before the second layer 184 is formed. The heating conditions (heating temperature and heating time) at this time are to the extent that the conductive particles of the first layer 182 are not sintered. In this way, it is possible to shorten the time taken to form the conductor 180.

FIG. 5 is a diagram illustrating results obtained by examining the periods of time from completion of the first layer 182 until start of formation of the second layer 184 (the foregoing predetermined period of time) and the quality of the cross-sectional profile of the conductor 180 when forming the conductor 180 using silver nanoparticle-containing ink. The conductor 180 was formed under atmospheric pressure and the temperature of the substrate 100 was 20° C. An amount of liquid droplet ejected from the ejection nozzle 202 was 7 pl. As illustrated in the drawing, when the foregoing b/a is 0.7 or 1.4, the cross-sectional profile of the conductor 180 was good. Conversely, when the value for b/a exceeded the value 5, the cross-sectional profile of the conductor 180 was deteriorated. From this result, it can be said that $0.5 \leq b/a \leq 3$ is preferable.

As described above, according to the present embodiment, the conductor 180 is formed by coating the ink in layers by inkjet printing and baking the ink. Therefore, the conductor 180 can be increased in height without being increased in width. Accordingly, the resistance of the conductor 180 can be lowered without increasing the width of the conductor 180. Since the first layer 182 of the conductor 180 is dried to some extent before forming the second layer 184 of the conductor 180, the width of the conductor 180 is not spread, and the unevenness of the upper surface of the conductor 180 is also small. If the first layer 182 is coated and baked, and then the second layer 184 is coated and baked, unevenness occurs on the upper surface of the first layer 182, causing the width of the second layer 184, that is, the width of the conductor 180, to spread. In contrast thereto, in the present embodiment, since the ink is applied in layers before baking, the width of the conductor 180 does not spread.

Second Embodiment

Figure 6:
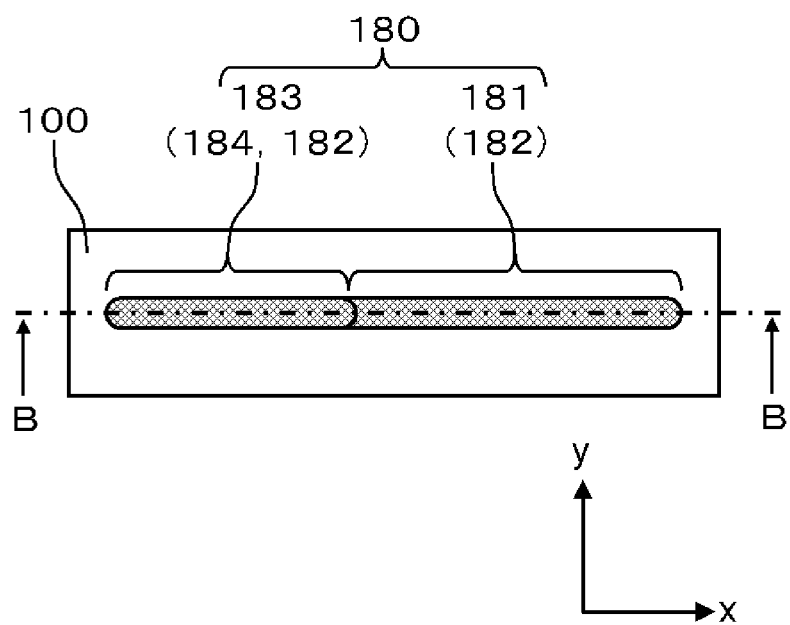
FIG. 6 is a plan view illustrating the configuration of a conductor according to a second embodiment.
Figure 7:
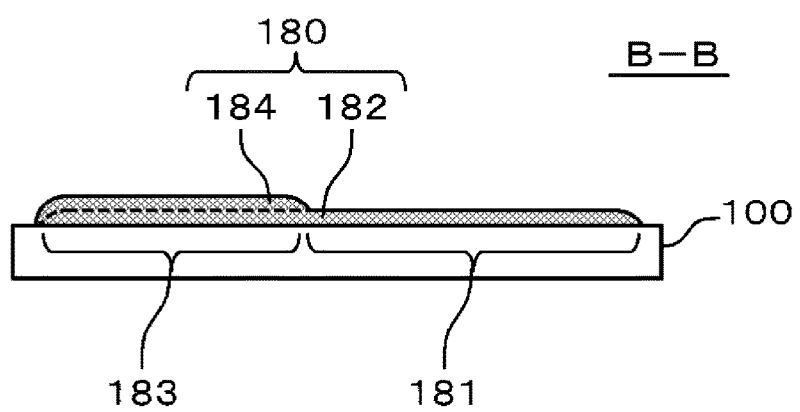
FIG. 7 is a sectional view taken along line B-B of FIG. 6.

FIG. 6 is a plan view illustrating the configuration of a conductor 180 according to a second embodiment. FIG. 7 is a sectional view taken along line B-B of FIG. 6. The conductor 180 according to the second embodiment has the same configuration as the conductor 180 according to the first embodiment except that the conductor 180 further includes a first portion 181 and a second portion 183.

The first portion 181 is formed only of the first layer 182. On the other hand, the second portion 183 is formed by laminating a second layer 184 and the first layer 182. Therefore, the second portion 183 is thicker than the first portion 181. The above is achieved by forming the second layer 184 only in a portion to be the second portion 183.

In the example illustrated in the drawings, the first portion 181 is formed by coating the conductive ink once, whereas the second portion 183 is formed by coating the conductive ink twice. Thereby, the thickness of the second portion 183 is equal to or greater than 180% and equal to or less than 220% of the thickness of the first portion 181. Here, the second portion 183 may be formed by further layering the conductive ink. In this case, the thickness of the second portion 183 is equal to or greater than 90% and equal to or less than 110% of a multiple of n of the thickness of the first portion 181 (where n is a positive number of 3 or more). The width of the first portion 181 is equal to or greater than 90% and equal to or less than 120% of the width of the second portion 183.

Both the length of the first portion 181 and the length of the first layer 182 are equal to or greater than 50 μm. Both the thickness of the first portion 181 and the thickness of the second portion 183 are each substantially constant except for end portions. The thickness of the conductor 180 is gradually changed at the boundary between the first portion 181 and the second portion 183.

Also in the present embodiment, the resistance of the conductor 180 can be lowered without increasing the width of the conductor 180. The width of the conductor 180 is not increased and unevenness of the upper surface of the conductor 180 is reduced. The present embodiment allows the conductor 180 to be made thick in only a portion.

Example 1

Figure 8:
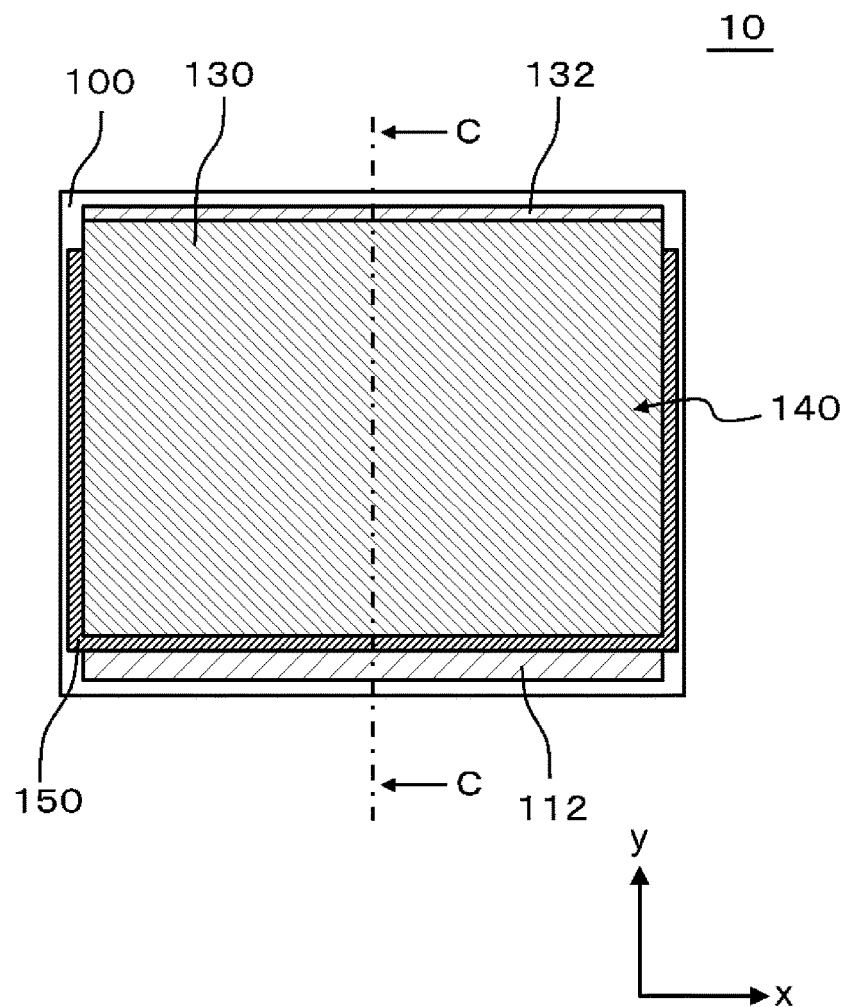
FIG. 8 is a plan view illustrating the configuration of a light emitting device according to Example 1.
Figure 9:
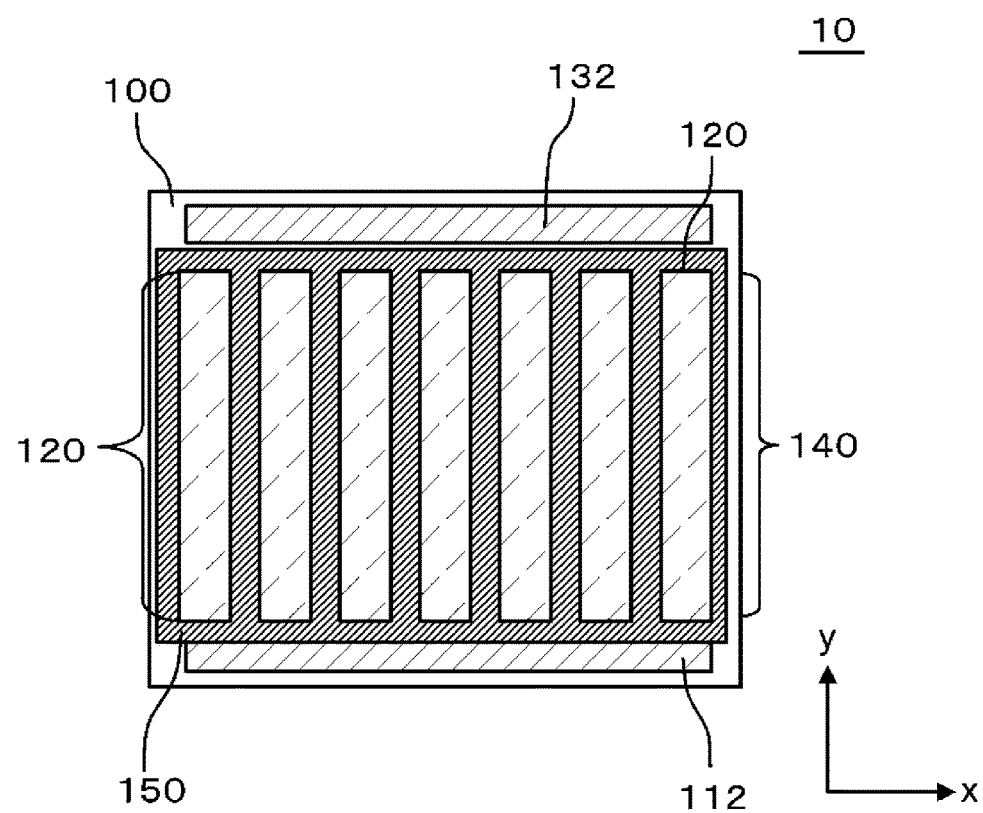
FIG. 9 is a diagram in which a second electrode is removed from FIG. 8.
Figure 10:
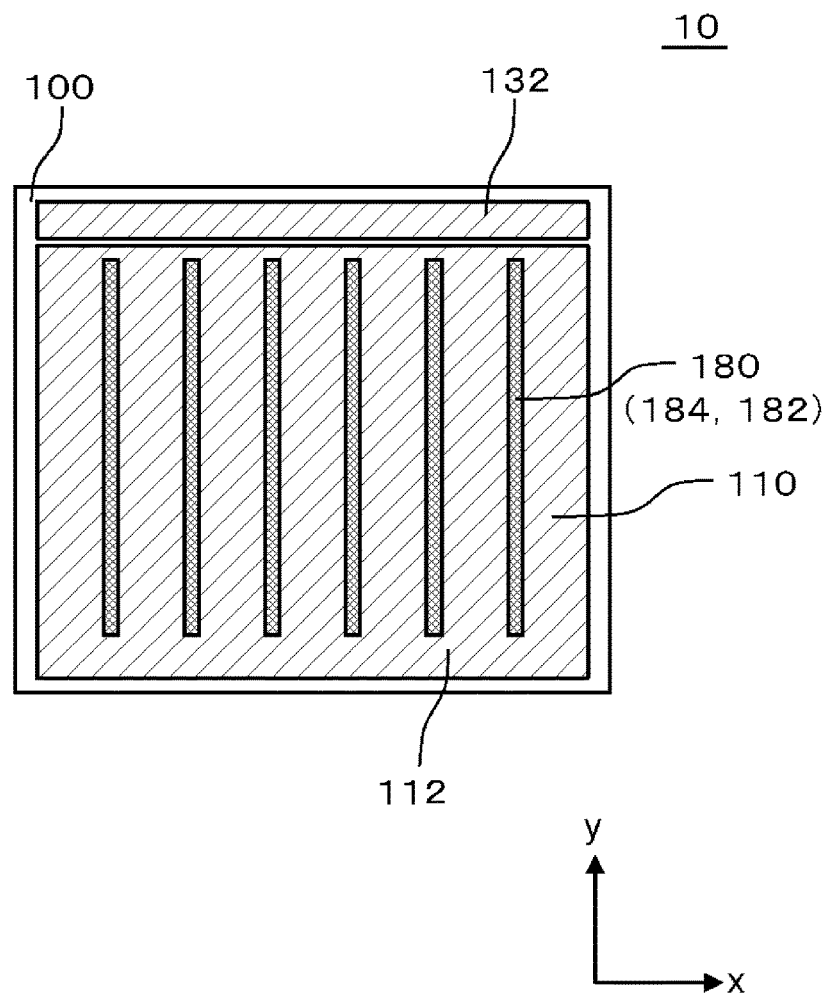
FIG. 10 is a diagram in which an insulating layer and an organic layer are removed from FIG. 9.
Figure 11:
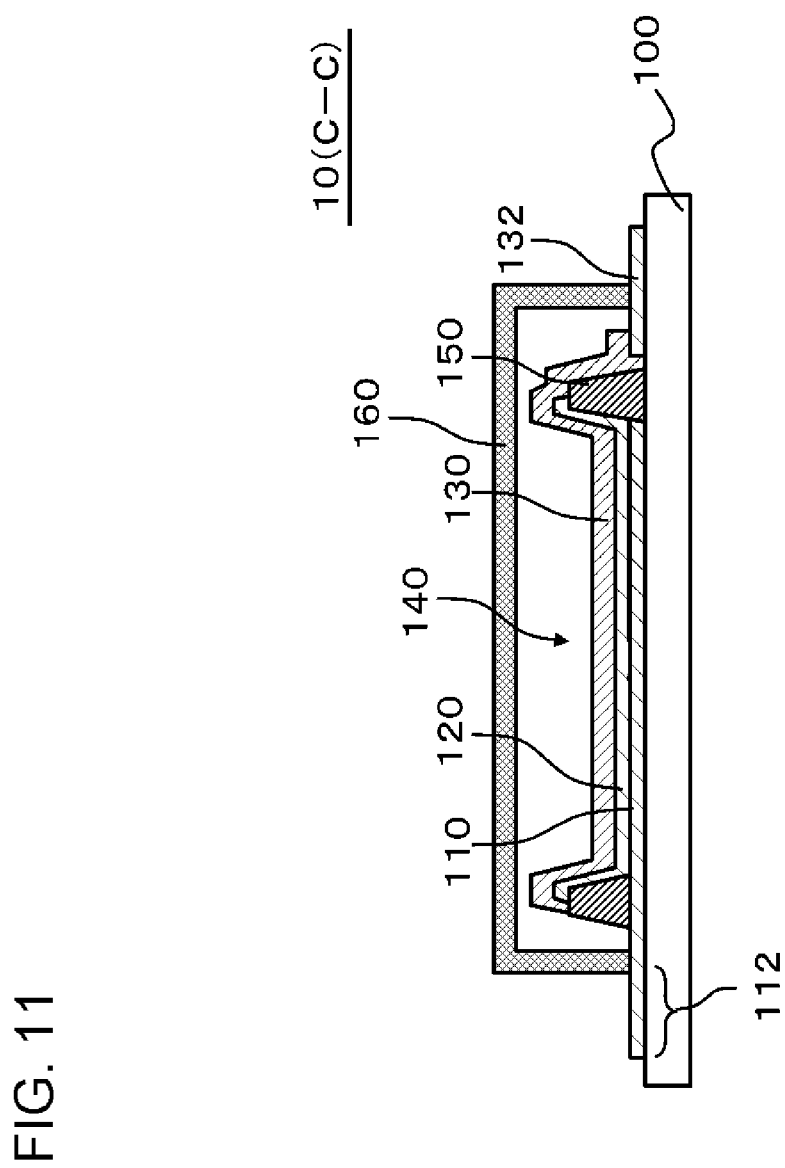
FIG. 11 is a sectional view taken along line C-C of FIG. 8.

FIG. 8 is a plan view illustrating the configuration of a light emitting device 10 according to Example 1. FIG. 9 is a diagram in which the second electrode 130 is removed from FIG. 8. FIG. 10 is a diagram in which an insulating layer 150 and an organic layer 120 are removed from FIG. 9. FIG. 11 is a sectional view taken along line C-C of FIG. 8. A sealing unit 160 in FIG. 8 is not illustrated for ease of explanation.

The light emitting device 10 according to the present example includes a substrate 100, a light emitting unit 140, and a conductor 180. The light emitting unit 140 is formed on the substrate 100 and includes a first electrode 110, a second electrode 130, and an organic layer 120. The organic layer 120 is located between the first electrode 110 and the second electrode 130. The conductor 180 is an auxiliary electrode of the first electrode 110 and is in contact with any surface of the first electrode 110. In the example illustrated in the drawings, the conductor 180 is formed on a surface of the first electrode 110 facing the organic layer 120. The conductor 180 has the same configuration as that according to the first embodiment.

Hereinafter, the light emitting device 10 will be described in detail.

When the light emitting device 10 is a bottom emission type to be described below, the substrate 100 is formed of, for example, a light transmissive material such as glass or a light transmissive resin. Here, when the light emitting device 10 is a top emission type to be described below, the substrate 100 may be formed of a non-light-transmissive material. The substrate 100 has, for example, a polygonal shape such as a rectangular shape. Here, the substrate 100 may have flexibility. When the substrate 100 has flexibility, the thickness of the substrate 100 is, for example, equal to or greater than 10 μm and equal to or less than 1,000 μm. In particular, when the substrate 100 is a glass material made to have flexibility, the thickness of the substrate 100 is, for example, equal to or less than 200 μm. When the substrate 100 is a resin material made to have flexibility, the substrate 100 is formed to contain, for example, a material such as polyethylene naphthalate (PEN), polyether sulphone (PES), polyethylene terephthalate (PET), or polyimide. When the substrate 100 includes a resin material, an inorganic barrier film such as $SiN_x$ or SiON is formed on at least a light emitting surface (preferably, both surfaces) of the substrate 100 to prevent moisture from being transmitted through the substrate 100.

The light emitting unit 140 is formed on the substrate 100. The light emitting unit 140 has a configuration for emitting light, which is, for example, an organic EL element. The organic EL element is configured by laminating the first electrode 110, the organic layer 120, and the second electrode 130 in this order.

The first electrode 110 is a transparent electrode having light transmitting properties. A transparent conductive material composing the transparent electrode is a material containing a metal, for example, a metal oxide such as indium tin oxide (ITO), an indium zinc oxide (IZO), indium tungsten zinc oxide (IWZO), or zinc oxide (ZnO). The thickness of the first electrode 110 is, for example, equal to or greater than 10 nm and equal to or less than 500 nm. The first electrode 110 is formed by, for example, sputtering or vapor deposition. Moreover, the first electrode 110 may be a conductive organic material such as carbon nanotubes or PEDOT/PSS.

The second electrode 130 includes a metal layer formed of a metal selected from a first group consisting of, for example, Al, Au, Ag, Pt, Mg, Sn, Zn, and In or an alloy of metals selected from the first group. In this case, the second electrode 130 has light shielding properties. The thickness of the second electrode 130 is, for example, equal to or greater than 10 nm and equal to or less than 500 nm. Here, the second electrode 130 may be formed using a material exemplified as the material of the first electrode 110. The second electrode 130 is formed by, for example, sputtering or vapor deposition.

The materials of the foregoing first electrode 110 and second electrode 130 are examples for when transmitting light through the substrate 100, that is, for performing light emission from the light emitting device 10 through the substrate 100 (a bottom emission light emitting device). As a different case, light may be transmitted through a side opposite to the substrate 100. That is, light emission from the light emitting device 10 is performed without passing through the substrate 100 (a top emission light emitting device). In the top emission light emitting device, two types of laminating structures of an inverted layer sequence and a standard layer sequence, may be adopted. In the inverted layer sequence, the material of the first electrode 110 and the material of the second electrode 130 are reversed to those of the bottom emission light emitting device. That is, the foregoing material of the second electrode 130 is used as the material of the first electrode 110 and the foregoing material of the first electrode 110 is used as the material of the second electrode 130. In contrast, in the standard layer sequence, the material of the first electrode 110 is formed on the foregoing material of the second electrode 130, the organic layer 120 is formed on the first electrode 110, and the second electrode 130, made into a thin film, is further formed on the organic layer 120, thus achieving a structure for taking out light from the side opposite to the substrate 100. The material used to form the thin film is exemplified as the material of the second electrode 130 or an MgAg alloy, and the thickness of the thin film is, for example, equal to or less than 30 nm. The light emitting device 10 according to the present example may have any type of structure among the bottom emission light emitting device and the foregoing two types of top emission light emitting devices.

The organic layer 120 is configured by laminating, for example, a hole injection layer, a light emitting layer, and an electron injection layer in this order. A hole transport layer may be formed between the hole injection layer and the light emitting layer. In addition, an electron transport layer may be formed between the light emitting layer and the electronic injection layer. The organic layer 120 may be formed by vapor deposition. Further, at least one layer of the organic layer 120, for example, a layer in contact with the first electrode, may be formed by a coating method such as inkjet printing, printing, or spraying. In this case, the remaining layers of the organic layer 120 are formed by vapor deposition. Moreover, all the layers of the organic layer 120 may be formed using a coating method.

The light emitting device 10 includes a first terminal 112 and a second terminal 132. The first terminal 112 is connected to the first electrode 110 and the second terminal 132 is connected to the second electrode 130. The first terminal 112 and the second terminal 132 have, for example, a layer formed of the same material as the first electrode 110. A lead-out interconnect may be formed between the first terminal 112 and the first electrode 110. In addition, a lead-out interconnect may be formed between the second terminal 132 and the second electrode 130.

As illustrated in FIG. 10, the conductor 180 is formed on the first electrode 110. The conductor 180 is an auxiliary electrode of the first electrode 110 and formed in plural numbers over the first electrode 110. In the example illustrated in the drawing, the plural conductors 180 extend in the y direction and disposed at an interval in the x direction.

The conductors 180 are formed using the method described in the first embodiment. Therefore, the conductors 180 have an increased height. As a result, the cross-sectional areas of the conductors 180 can be increased without increasing the widths thereof. Accordingly, the resistance of the conductors 180 can be lowered without increasing regions of the light emitting unit 140 covered by the conductors 180 (that is, without increasing a non-light-radiating region).

Moreover, the light emitting device 10 includes the insulating layer 150. The insulating layer 150 is provided on the substrate 100 for defining the light emitting region of the light emitting unit 140. In the example illustrated in FIG. 11, the insulating layer 150 covers the edge of the first electrode 110 and the conductor 180. The insulating layer 150 is formed of, for example, a material such as polyimide, epoxy, an acrylic or novolac-based resin material. The insulating layer 150 is formed, for example, by mixing a photosensitive material in the resin material to be the insulating layer 150 and coating the mixed material and, subsequently, the resin material is exposed and developed. Alternatively, the insulating layer 150 may be formed by inkjet printing or screen printing.

As illustrated in FIG. 11, the light emitting device 10 includes a sealing unit 160. The sealing unit 160 seals the light emitting unit 140. The sealing unit 160 illustrated in the drawing is a sealing member and is formed using, for example, glass, a metal such as aluminum, or a resin. The sealing unit 160 is polygonal, similarly to the substrate 100, or is circular and has a shape in which a concave portion is formed in the middle. The edge of the sealing unit 160 is fixed to the substrate 100 by an adhesive material. Thus, a space surrounded by the sealing unit 160 and the substrate 100 is sealed. The light emitting unit 140 is located in the sealed space.

The sealing member may be a film formed by atomic layer deposition (ALD) or by chemical vapor deposition (CVD) or sputtering. The thickness of the sealing film is, for example, equal to or greater than 10 nm and equal to or less than 1,000 nm. In the case the sealing film is formed by ALD, the sealing film includes at least one of an aluminum oxide film and a titanium oxide film, for example. When the sealing film is formed by CVD or sputtering, the sealing film is formed of an insulating film such as $SiO_2$ or SiN.

Next, a method of manufacturing the light emitting device 10 will be described. First, the first electrode 110 is formed on the substrate 100. In this process, the first terminal 112 and the second terminal 132 are also formed. Subsequently, the conductor 180 is formed on the first electrode 110. The method of forming the conductor 180 has been described in the first embodiment. Subsequently, a resin material to be the insulating layer 150 is coated on the substrate 100, and the resin material is exposed and developed. Thus, the insulating layer 150 is formed.

Subsequently, the organic layer 120 is formed in a region of the first electrode 110 surrounded by the first insulating layer 150. Then, the second electrode 130 is formed. Thereafter, the sealing unit 160 is provided.

As described above, according to the present example, the light emitting device 10 includes the conductor 180 as the auxiliary electrode of the first electrode 110. The conductor 180 is formed using the method described in the first embodiment. Therefore, the conductor 180 is increased in height. Accordingly, the resistance of the conductor 180 can be lowered without increasing the region, in the light emitting unit 140, covered by the conductor 180 (that is, without increasing a non-light-radiating region).

Example 2

Figure 12:
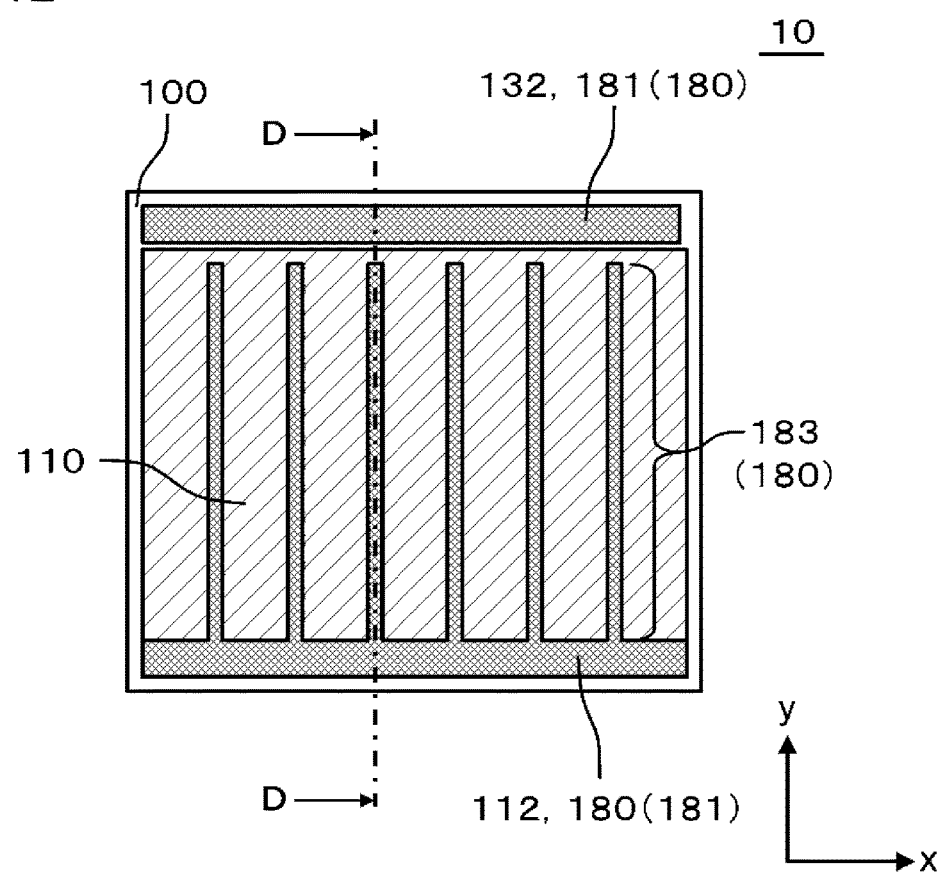
FIG. 12 is a plan view illustrating the configuration of a light emitting device according to Example 2.
Figure 13:
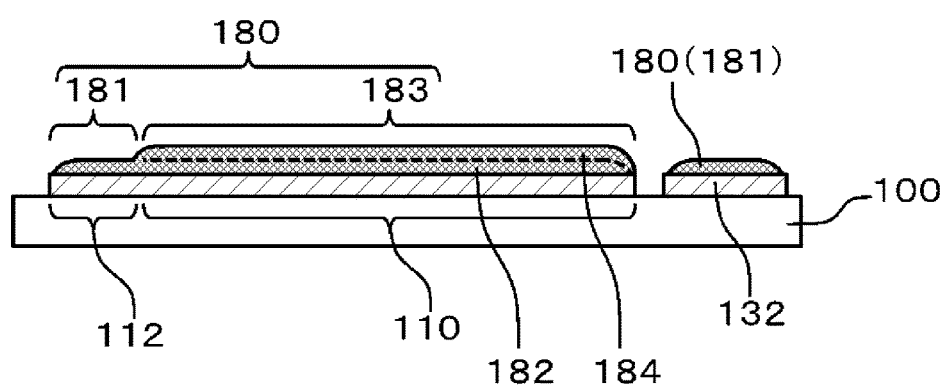
FIG. 13 is a sectional view taken along line D-D of FIG. 12.

FIG. 12 is a plan view illustrating the configuration of a light emitting device 10 according to Example 2 and corresponds to FIG. 10 in Example 1. FIG. 13 is a sectional view taken along line D-D of FIG. 12. The light emitting device 10 according to the present example has the same configuration as the light emitting device 10 according to Example 1 except that the conductor 180 is also formed on the first terminal 112 and on the second terminal 132.

More specifically, the conductor 180 on the first terminal 112 is formed continuously with the conductor 180 on the first electrode 110. The conductor 180 on the first terminal 112 and the conductor 180 on the first electrode 110 have the configuration described in the second embodiment. Specifically, the conductor 180 on the first electrode 110 is the second portion 183 and the conductor 180 on the first terminal 112 is the first portion 181. The second portion 183 and the first portion 181 are aligned in the extending direction of the second portion 183 and connected to each other.

The conductor 180 on the second terminal 132 is the first portion 181, and therefore has the same thickness as the conductor 180 on the first terminal 112. The conductor 180 on the first terminal 112 and the conductor 180 on the second terminal 132 are formed as the first portions 181 since the first terminal 112 and the second terminal 132 do not require light transmissivity, and the resistance of the conductor 180 can be lowered by enlarging the width of the conductor 180. Further, the width (in the y direction of FIG. 12) of the conductor 180 on the first terminal 112 may be the same as the width (in the x direction of FIG. 12) of the conductor 180 (that is, the portion functioning as the auxiliary electrode). In this case, the first terminal 112 is connected, from a side face side of the light emitting device 10, to an interconnect for supplying a current. In this way, the non-light emitting region can be reduced and the aperture ratio of the light emitting device 10 can be improved.

The first portion 181 of the conductor 180 may be provided in a portion not overlapping any of the first terminal 112 and the second terminal 132.

A method of manufacturing the light emitting device 10 according to the present example is the same as the method of manufacturing the light emitting device 10 according to Example 1.

Also according to the present example, it is possible to lower the resistance of the conductor 180 without increasing the region of the light emitting unit 140 covered by the conductor 180, as in Example 1. Since the first terminal 112 and the second terminal 132 can be covered by the conductor 180, the resistance of the first terminal 112 and the second terminal 132 can be lowered. Further, since the conductor 180 on the first terminal 112 and the conductor 180 on the second terminal 132 can be thinner than the conductor 180 on the first electrode 110, it is possible to shorten the time taken to form the conductors 180 on the first terminal 112 and the second terminal 132.

In the present example, the first portion 181 is located in the light emitting region and the second portion 183 is located in the non-light emitting region. In other words, the first portion 181 is formed on the first terminal 112 and the second portion 183 is formed on the first electrode 110. Here, the layouts of the first portion 181 and the second portion 183 are not limited thereto. The first portion 181 may additionally be formed on the first electrode 110 and the second portion 183 may be formed in only a part of the first electrode 110, preferably near the center of the first electrode 110. This is for suppressing deterioration in luminance caused due to an increase in resistance near the center of the light emitting surface of the light emitting device 10. In addition, when a certain spot is expected to have high resistance on design of the light emitting device 10, the second portion 183 may be formed in that spot. Since the thickness of the second portion 183 may be an integer multiple of another portion, a current value or a resistance value is relatively easily calculated.

Example 3

Figure 14:
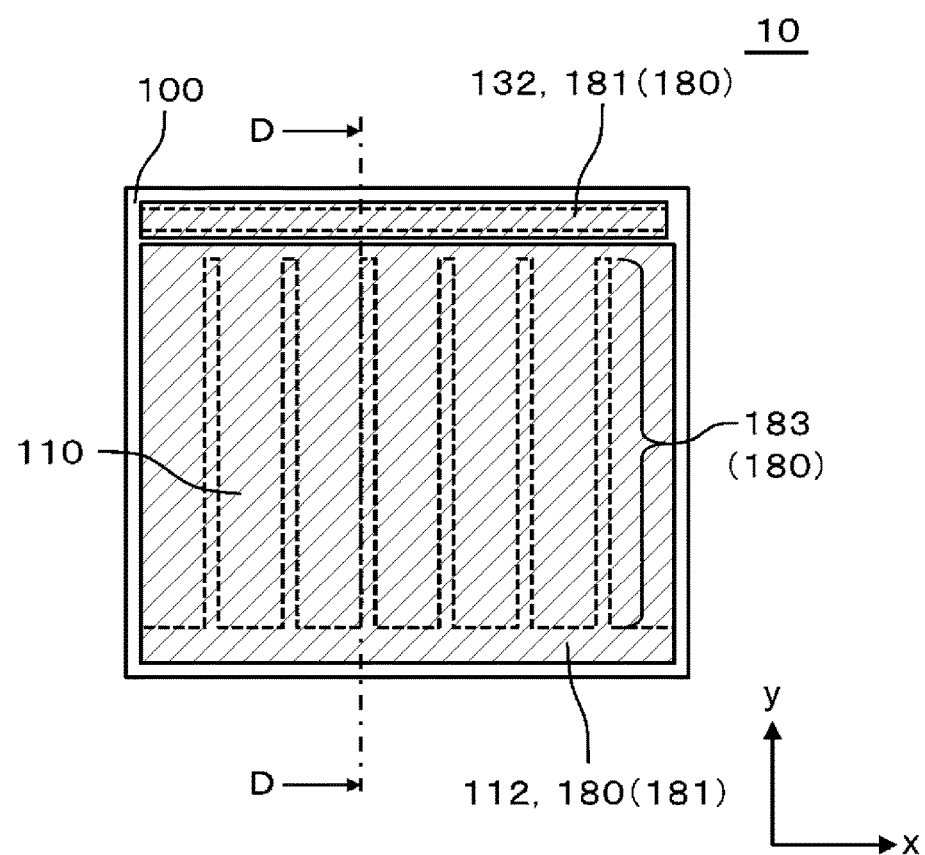
FIG. 14 is a plan view illustrating the configuration of a light emitting device according to Example 3.

FIG. 14 is a plan view illustrating the configuration of a light emitting device 10 according to Example 3 and corresponds to FIG. 12 in Example 2. The light emitting device 10 according to the present example has the same configuration as the light emitting device 10 according to Example 2 except that the conductor 180 is formed below the first electrode 110, below the first terminal 112, and below the second terminal 132. In other words, in the present example, the conductor 180 is formed between the first electrode 110 and the substrate 100, between the first terminal 112 and the substrate 100, and between the second terminal 132 and the substrate 100.

A method of manufacturing the light emitting device 10 according to the present example is the same as the method of manufacturing the light emitting device 10 according to Example 2 except that the conductor 180 is formed before forming the first electrode 110, the first terminal 112, and the second terminal 132.

In the present example, as in Example 2, resistance of the conductor 180 can be lowered without increasing the region of the light emitting unit 140 covered by the conductor 180. Further, the manufacturing time for forming the conductor 180 on the first terminal 112 and on the second terminal 132 is able to be shortened.

Example 4

Figure 15:
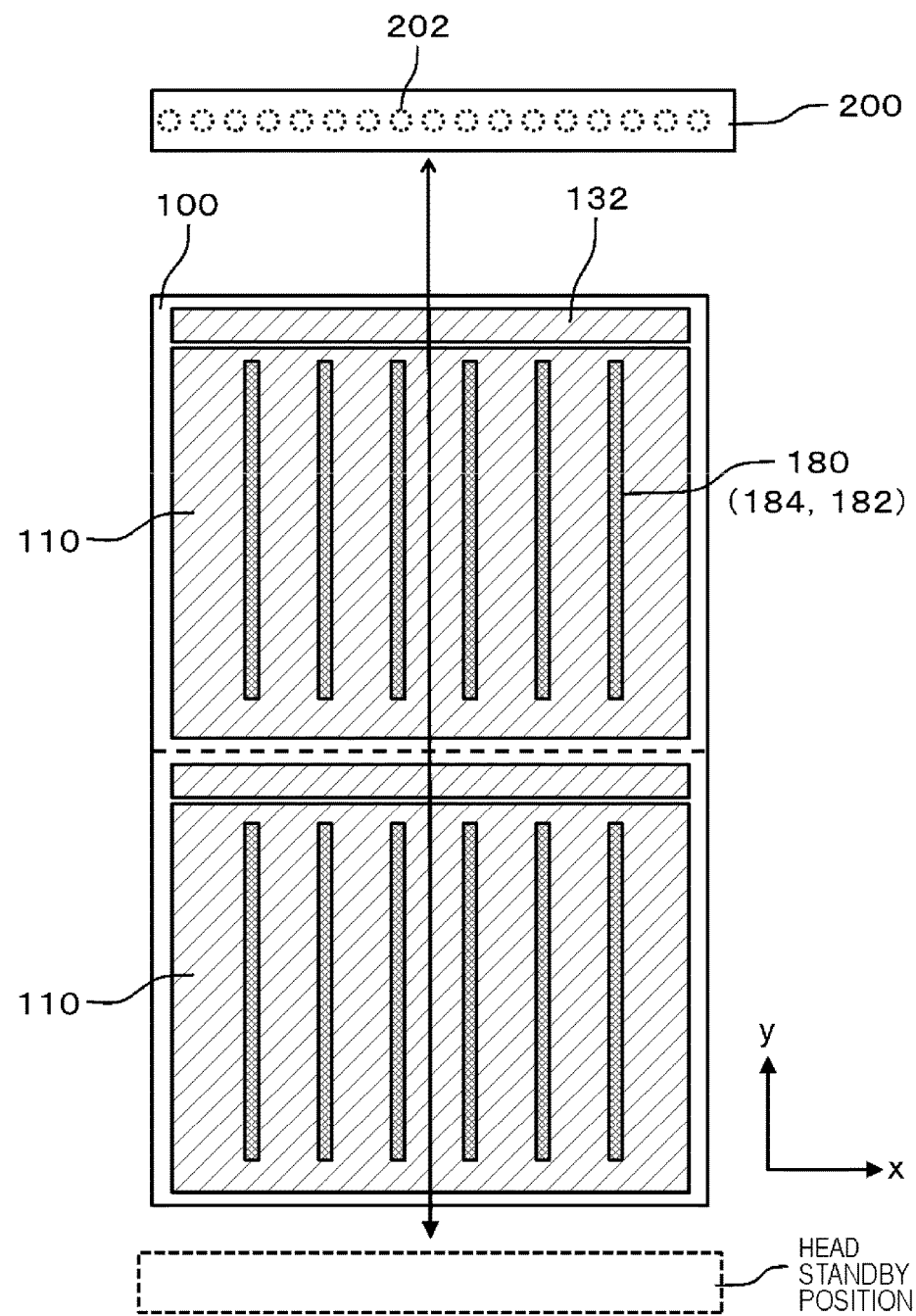
FIG. 15 is a plan view illustrating a method of manufacturing a light emitting device according to Example 4.

FIG. 15 is a plan view illustrating a method of manufacturing a light emitting device 10 according to Example 4. In the present example, the configuration of the light emitting device 10 is the same as one of Examples 1 to 3. FIG. 15 illustrates the same case as that of Example 1.

In the present example, when the light emitting devices 10 are manufactured, plural substrates 100 are connected to each other in the extending direction of the conductors 180 (a first direction: the y direction in FIG. 15). When the first layer 182 of the conductor 180 is formed, the ejection head 200 is moved from a standby position in the first direction. Thus, the first layer 182 of the conductor 180 is formed in each of the plural substrates 100.

Thereafter, before the second layer 184 is formed, the ejection head 200 is moved in a direction opposite to the first direction (the y direction in FIG. 15) without ejecting ink, returning to the standby position. The number of substrates 100 is set so that the predetermined period of time described in the first embodiment elapses while the ejection head 200 is being returned.

Then, the second layer 184 is formed in each of the plural substrates 100 by moving the ejection head 200 again in the first direction.

Subsequently, after forming the light emitting units 140, the plural substrates 100 are separated from each other. This separation may be performed after the sealing units 160 are disposed (or formed) or may be performed before the light emitting devices 10 are disposed (or formed).

According to the present example, after forming the first layer 182, while the ejection head 200 is returning to the standby position for forming the second layer 184 next, the first layer 182 becomes a desired dry state. Therefore, it is not necessary to make the ejection head 200 stand by in any place in order to dry the first layer 182. Accordingly, the time necessary to manufacture the light emitting device 10 is shortened.

The embodiments and the examples have been described above with reference to the drawings. However, the embodiments and the examples are exemplary. For example, the invention can also be applied to a display device in which plural light emitting pixels are arrayed in a matrix by providing the plural first electrodes 110 in a first direction, providing the plural second electrodes 130 in a second direction orthogonal to the first direction, and providing organic layers at intersections of the first electrodes 110 and the second electrodes 130. For example, in the conductor 180 of the display device, a portion superimposed with a terminal may be the first portion 181 and a portion superimposed with the first electrode 110 may be the second portion 183. In this way, in the invention, other various configurations may be adopted.

The invention claimed is:

1. A light emitting device comprising:
a substrate;
a light emitting unit over the substrate, the light emitting unit comprising a first electrode, a second electrode, and an organic layer between the first electrode and the second electrode; and
a conductor extending in a first direction, at least a portion of the conductor in contact with any surface of the first electrode,
wherein the conductor contains a conductive particle and comprises a first portion and a second portion, the first portion and second portion comprising the same conductive particle,
wherein the second portion comprises a plurality of layers of a coating material, the second portion is thicker than the first portion, and the first and second portions are aligned in the first direction and connected to each other.

2. The light emitting device according to claim 1,
wherein on a cross-sectional surface in a second direction orthogonal to the first direction, a width of the first portion is within a range that is equal to or greater than 90% and equal to or less than 120% of a width of the second portion.

3. The light emitting device according to claim 1,
wherein the conductor is composed of a plurality of the conductive particles bound to each other.

4. The light emitting device according to claim 1,
wherein the conductive particles are nanoparticles.

5. The light emitting device according to claim 1, further comprising:
a terminal over the substrate, the terminal electrically connected to the first electrode,
wherein the first portion of the conductor is superimposed on the terminal.

6. The light emitting device according to claim 1,
wherein a thickness of the second portion is within a range that is equal to or greater than 90% and equal to or less than 110% of a multiple of n of a thickness of the first portion (where n is a positive number of 2 or more).

7. The light emitting device according to claim 6,
wherein the plurality of layers of the coating material are applied sequentially within a prescribed time period to form the second portion.

8. The light emitting device according to claim 1,
wherein a plurality of the first electrodes extend in the first direction,
wherein a plurality of the second electrodes extend in the second direction orthogonal to the first direction, and
wherein the organic layer is provided at each intersection of the first electrodes and the second electrodes.

9. The light emitting device according to claim 1,
wherein the conductor extends in the first direction as viewed from a direction perpendicular to a surface of the substrate.

10. The light emitting device according to claim 1,
wherein the first portion does not overlap the organic layer.

* * * * *